United States Patent
Bedeschi

(10) Patent No.: US 12,112,801 B2
(45) Date of Patent: Oct. 8, 2024

(54) FORWARD LOOKING ALGORITHM FOR VERTICAL INTEGRATED CROSS-POINT ARRAY MEMORY

(71) Applicant: Micron Technology, Inc., Boise, ID (US)

(72) Inventor: Ferdinando Bedeschi, Biassono (IT)

(73) Assignee: Micron Technology, Inc., Boise, ID (US)

( * ) Notice: Subject to any disclaimer, the term of this patent is extended or adjusted under 35 U.S.C. 154(b) by 230 days.

(21) Appl. No.: 17/897,021

(22) Filed: Aug. 26, 2022

(65) Prior Publication Data

US 2024/0071488 A1 Feb. 29, 2024

(51) Int. Cl.
*G11C 7/14* (2006.01)
*G11C 13/00* (2006.01)
*G11C 16/28* (2006.01)

(52) U.S. Cl.
CPC ...... *G11C 13/0035* (2013.01); *G11C 13/0004* (2013.01); *G11C 13/004* (2013.01)

(58) Field of Classification Search
CPC ............ G11C 13/0035; G11C 13/0004; G11C 13/004; G11C 13/0033; G11C 13/0061; G11C 2013/0052; G11C 2013/0057
See application file for complete search history.

(56) References Cited

U.S. PATENT DOCUMENTS

| | | | | |
|---|---|---|---|---|
| 10,431,301 | B2* | 10/2019 | Mirichigni | G11C 13/0004 |
| 10,566,052 | B2* | 2/2020 | Mirichigni | G11C 13/0033 |
| 10,600,480 | B2 | 3/2020 | Mirichigni et al. | |
| 2013/0080858 | A1* | 3/2013 | Lee | G11C 11/5642 714/E11.054 |
| 2017/0300252 | A1* | 10/2017 | Yim | G06F 3/0688 |
| 2019/0087125 | A1* | 3/2019 | Matsumoto | G06F 3/0619 |
| 2020/0201726 | A1* | 6/2020 | Lee | G06F 11/1012 |
| 2023/0067396 | A1 | 3/2023 | Sarpatwari et al. | |
| 2023/0110946 | A1 | 4/2023 | Muzzetto et al. | |

FOREIGN PATENT DOCUMENTS

| | | |
|---|---|---|
| WO | 2021229260 | 11/2021 |
| WO | 2022013589 | 1/2022 |

\* cited by examiner

*Primary Examiner* — Hien N Nguyen
(74) *Attorney, Agent, or Firm* — Greenberg Traurig

(57) ABSTRACT

Systems and methods for reading a first and second plurality of memory cells include applying a first ramping voltage with a first increment for each ramping step to read the first plurality of cells, counting, among the first plurality of cells at each ramping step, a first number of logic 1 cells, comparing the first number with a threshold at each ramping step of the first ramping voltage, determining a first voltage reached by the first ramping voltage, at the first voltage the first number becoming equal to or higher than the threshold for the first time, applying a second voltage lower than the first voltage to read the second plurality of cells, and applying a second ramping voltage ramping up from the second voltage with a second predetermined increment lower than the first predetermined increment for each ramping step to read the second plurality of cells.

20 Claims, 9 Drawing Sheets

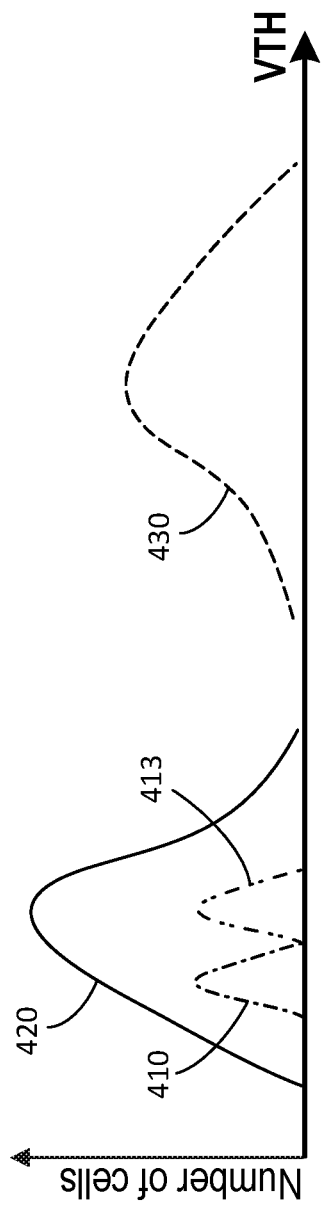
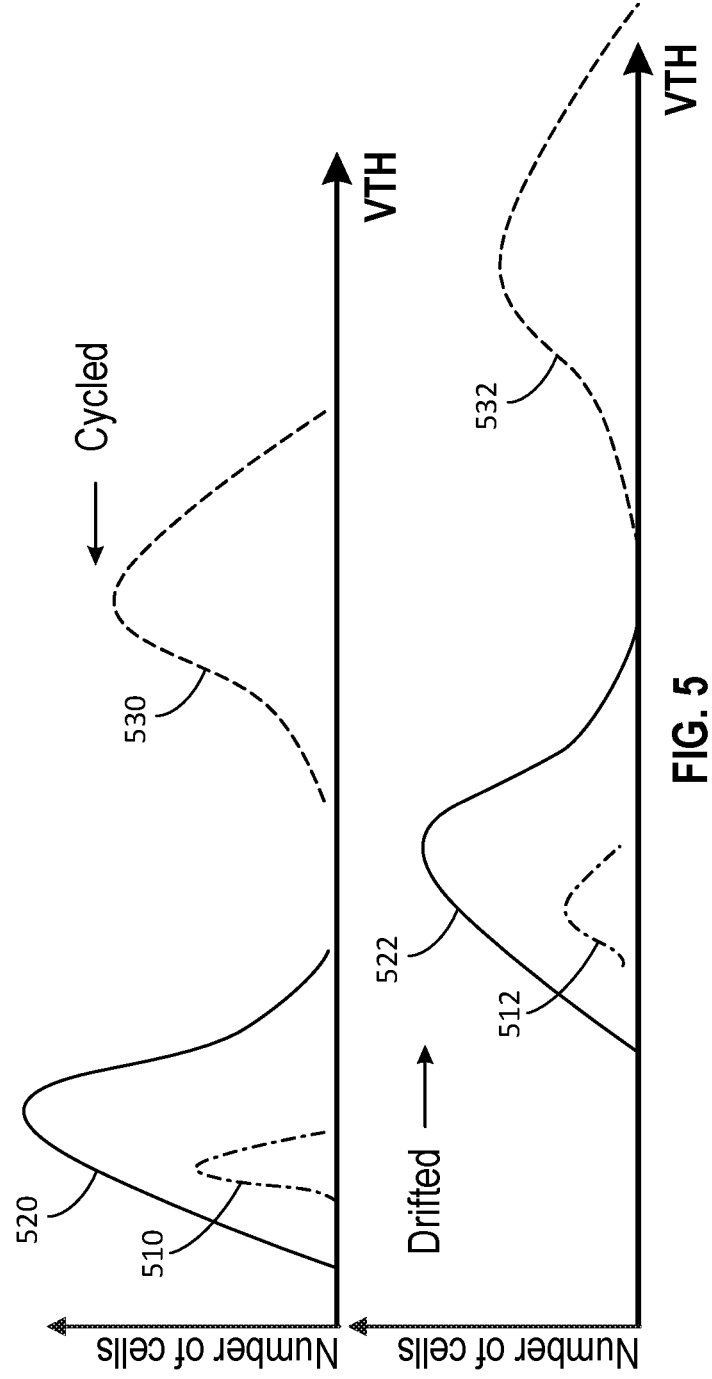

| Invert Bits | Page Weight (%) | | Page Weight (Bit) | | | | | | | |
|---|---|---|---|---|---|---|---|---|---|---|
| | | | 16B | | 32B | | 64B | | 128B | |
| K | Min | Max | Min | Max | Min | Max | Min | Max | Min | Max |
| 1 | 50.00% | 100.00% | 64 | 128 | 128 | 256 | 256 | 512 | 512 | 1024 |
| 2 | 50.00% | 75.00% | 64 | 96 | 128 | 192 | 256 | 384 | 512 | 768 |
| 3 | 50.00% | 66.60% | 64 | 85 | 128 | 170 | 256 | 341 | 512 | 682 |
| 4 | 50.00% | 62.50% | 64 | 80 | 128 | 160 | 256 | 320 | 512 | 640 |
| 5 | 50.00% | 60.00% | 64 | 77 | 128 | 154 | 256 | 307 | 512 | 614 |
| 6 | 50.00% | 58.30% | 64 | 75 | 128 | 149 | 256 | 298 | 512 | 597 |
| 7 | 50.00% | 56.07% | 64 | 72 | 128 | 144 | 256 | 287 | 512 | 574 |
| 8 | 50.00% | 53.97% | 64 | 69 | 128 | 138 | 256 | 276 | 512 | 553 |

FIG. 10

FORWARD LOOKING ALGORITHM FOR VERTICAL INTEGRATED CROSS-POINT ARRAY MEMORY

FIELD OF THE TECHNOLOGY

At least some embodiments disclosed herein relate to operating a memory array in general, and more particularly, but not limited to read techniques for a vertical integrated cross-point array memory.

BACKGROUND

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0". In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory cells may maintain their stored logic state for extended periods of time even in the absence of an external power source. Volatile memory cells may lose their stored state over time unless they are periodically refreshed by an external power source.

A storage device is an example of a memory device. Typical computer storage devices have controllers that receive data access requests from host computers and perform programmed computing tasks to implement the requests in ways that may be specific to the media and structure configured in the storage devices. In one example, a memory controller manages data stored in memory and communicates with a computer device. In some examples, memory controllers are used in solid state drives for use in mobile devices or laptops, or media used in digital cameras.

Firmware can be used to operate a memory controller for a particular storage device. In one example, when a computer system or device reads data from or writes data to a memory device, it communicates with the memory controller.

Memory devices typically store data in memory cells. In some cases, memory cells exhibit non-uniform, variable electrical characteristics that may originate from various factors including statistical process variations, cycling events (e.g., read or write operations on the memory cells), or a drift (e.g., a change in resistance of a chalcogenide alloy), among others.

In one example, reading a set of data (e.g., a codeword, a page) is carried out by determining a read voltage (e.g., an estimated median of threshold voltages) of memory cells that store the set of data. In some cases, a memory device may include an array of PCM cells arranged in a 3D architecture, such as a cross-point architecture to store the set of data. In such architecture a resistance memory elements are placed at the cross-point of word-lines and bit-lines. Multiple such cross-point arrays can be stacked to form a high density memory.

PCM cells in a cross-point architecture may represent a first logic state (e.g., a logic 1, a SET state) associated with a first set of threshold voltages, or a second logic state (e.g., a logic 0, a RESET state) associated with a second set of threshold voltages. In some cases, data may be stored using encoding (e.g., error correction coding (ECC)) to recover data from errors in the data stored in the memory cells.

For resistance variable memory cells (e.g., PCM cells), one of a number of states (e.g., resistance states) can be set. For example, a single level cell (SLC) may be programmed to one of two states (e.g., logic 1 or 0), which can depend on whether the cell is programmed to a resistance above or below a particular level. As an additional example, various resistance variable memory cells can be programmed to one of multiple different states corresponding to multiple data states, e.g., 10, 01, 00, 11, 111, 101, 100, 1010, 1111, 0101, 0001, etc. Such cells may be referred to as multi state cells, multi-digit cells, and/or multi-level cells (MLCs).

The state of a resistance variable memory cell can be determined (e.g., read) by sensing current through the cell responsive to an applied interrogation voltage. The sensed current, which varies based on the resistance of the cell, can indicate the state of the cell (e.g., the binary data stored by the cell). The resistance of a programmed resistance variable memory cell can drift (e.g., shift) over time. Resistance drift can result in erroneous sensing of a resistance variable memory cell (e.g., a determination that the cell is in a state other than that to which it was programmed, among other issues).

A PCM cell, for example, may be programmed to a reset state (amorphous state) or a set state (crystalline state). A reset pulse (e.g., a pulse used to program a cell to a reset state) can include a relatively high current pulse applied to the cell for a relatively short period of time such that the phase change material of the cell melts and rapidly cools, resulting in a relatively small amount of crystallization. Conversely, a set pulse (e.g., a pulse used to program a cell to a set state) can include a relatively lower current pulse applied to the cell for a relatively longer time interval and with a slower quenching speed, which results in an increased crystallization of the phase change material.

A programming signal can be applied to a selected memory cell to program the cell to a target state. A read signal can be applied to a selected memory cell to read the cell (e.g., to determine the state of the cell). The programming signal and the read signal can be current and/or voltage pulses, for example.

BRIEF DESCRIPTION OF THE DRAWINGS

The embodiments are illustrated by way of example and not limitation in the figures of the accompanying drawings in which like references indicate similar elements.

FIG. 4 shows an exemplary threshold voltage (VTH) distribution of memory cells in a codeword.

FIG. 5 shows exemplary shifts of threshold voltage (VTH) distributions of memory cells in a codeword.

FIG. 10 shows a table illustrating an exemplary data manipulation by constraining logic 1's.

DETAILED DESCRIPTION

Figure 1:
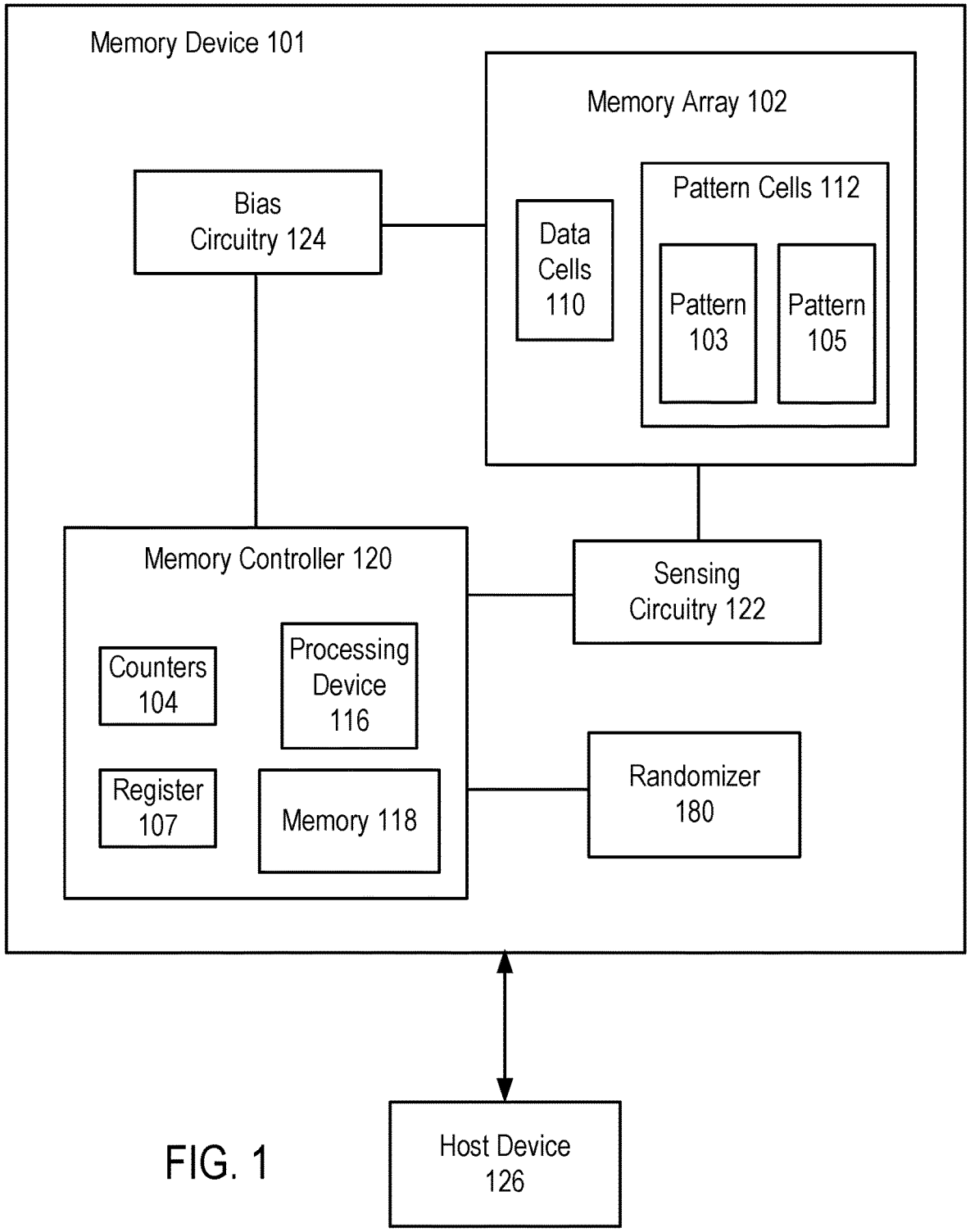
FIG. 1 shows a memory device that uses reference patterns to select a read voltage for performing read operations, in accordance with some embodiments.

The following disclosure describes various embodiments for tracking threshold voltage drift in memory cells. At least some embodiments herein relate to a forward looking algorithm (FLA) for tracking threshold voltage drift in vertical integrated cross-point array memory. In one example, a method for reading a memory array having a first and second plurality of cells located adjacent to each other includes applying a first ramping voltage with a first predetermined increment for each ramping step to read the first plurality of cells, counting, among the first plurality of cells at each ramping step of the first ramping voltage, a first number of cells at a logic 1 state, comparing the first number with a first predetermined threshold at each ramping step of the first ramping voltage, determining a first voltage reached by the first ramping voltage, at the first voltage the first number becoming equal to or higher than the first predetermined threshold for the first time, applying a second voltage to read the second plurality of cells, the second voltage being lower than the first voltage by a first predetermined amount, and applying a second ramping voltage ramping up from the second voltage with a second predetermined increment for each ramping step to read the second plurality of cells, the second predetermined increment being lower than the first predetermined increment by a second predetermined amount.

In one example, the first plurality of cells are known pattern cells and the second plurality of cells are data cells.

In one example, the above method further includes applying a third ramping voltage ramping up to the second voltage to read the second plurality of cells, the third ramping voltage using the first predetermined increment for each ramping step.

In one example, the above method further includes counting, among the second plurality of cells at each ramping step of the third ramping voltage, a second number of cells at a logic 1 state, and comparing the second number with a second predetermined threshold, determining the first voltage when both a first and second condition being satisfied for the first time, the first condition being the first number becoming equal to or higher than the first predetermined threshold and the second condition being the second number becoming larger than the second predetermined threshold.

In one example, the above method further includes counting, among the second plurality of cells at a first step of the second ramping voltage, a third number of cells at the logic 1 state, counting, among the second plurality of cells at a second step of the second ramping voltage, a fourth number of cells at the logic 1 state, the second step immediately following the first step, calculating a difference between the third number and the fourth number, and stopping the second ramping voltage when an absolute value of the difference being smaller than a third predetermined threshold.

In one example, the above method further includes providing the stopping voltage of the second ramping voltage to a sense amplifier.

In one example, the above method further includes adding a pulsed voltage to the stopping voltage of the second ramping voltage to read the second plurality of cells, and counting, among the second plurality of cells, a fifth number of cells at the logic 1 state.

In one example, the above method further includes reading a third plurality of cells reflecting page erase status and located adjacent the first and second plurality of cells, and stopping the first ramping voltage when a number of cells at a logic 0 state among the third plurality of cells exceeding a fourth predetermined threshold.

In one example, the above method further includes stopping the second ramping voltage when a predetermined number of steps in the second ramping voltage being reached.

The threshold voltage of a memory cell is such that when the voltage applied across the memory cell is increased to above the threshold voltage, the memory cell switches by changing rapidly or abruptly, snapping (e.g., for a chalcogenide memory cell), or jumping from a non-conductive state to a conductive state. The non-conductive state allows a small leak current to go through the memory cell; and in contrast, the conductive state allows more than a threshold amount of current to go through. Thus, a memory device can use a sensor (e.g., sense amplifier) to detect the change, or determine the conductive/non-conductive state of the memory device at one or more applied voltages, to evaluate or classify the level of the threshold voltage of the memory cell and thus its stored data.

The threshold voltage of a memory cell being configured/programmed to be in different voltage regions can be used to represent different data values stored in the memory cell. For example, the threshold voltage of the memory cell can be programmed to be in any of four predefined voltage regions; and each of the regions can be used to represent the bit values of a different two-bit data item. Thus, when given a two-bit data item, one of the four voltage regions can be selected based on a mapping between two-bit data items and voltage regions; and the threshold voltage of the memory cell can be adjusted, programmed, or configured to be in the selected voltage region to represent or store the given two-bit data item. To retrieve, determine, or read the data item from the memory cell, one or more read voltages can be applied across the memory cell to determine which of the four voltage regions contain the threshold voltage of the memory cell. The identification of the voltage region that contains the threshold voltage of the memory cell provides the two-bit data item that has been stored, programmed, or written into the memory cell.

For example, a memory cell can be configured or programmed to store a one-bit data item in a Single Level Cell (SLC) mode, or a two-bit data item in a Multi-Level Cell (MLC) mode, or a three-bit data item in a Triple Level Cell (TLC) mode, or a four-bit data item in Quad-Level Cell (QLC) mode.

The threshold voltage of a memory cell can change or drift over a period of time, usage, and/or read operations, and in response to certain environmental factors, such as temperature changes. The rate of change or drift can increase as the memory cell ages. The change or drift can result in errors in determining, retrieving, or reading the data item back from the memory cell.

It is difficult to know and/or predict an average threshold voltage for a distribution of data cells to be read (e.g., data cells in a codeword). When reading a codeword to determine data cells in, for example, a logic 1 or SET state, an initial read voltage is selected that is sufficiently low so that data cells in a logic 0 or RESET state are not inadvertently disturbed (e.g., read disturb due to a large number of reads of adjacent memory cells) and then gradually increased higher in small steps as needed to complete a read operation. However, if the initial read voltage is selected to be too low, then gradual stepping of the read voltage to an adequately high voltage can require significant time. This can significantly increase the time required for read operations, and thus can reduce the read bandwidth for a memory device.

In some cases, a threshold voltage distribution of data cells (e.g., codewords) can be tracked using a set of known pattern (KP) cells. For example, KP cells or bits are used to track a distribution, and the KP bits are read in parallel during a read of the data cells. In one example, each codeword has additional KP bits, and the KP bits are programmed to logic 1 at the same time as the codeword is written. The KP bits may be a few cells (e.g., 8 cells). Also, the KP bits may be specific for each logic state (e.g., KP0 bits for a logic 1 or SET state, and KP1 bits for a logic 0 or RESET state). During a read algorithm, the position of the data cell distribution can be estimated by observing behavior of known pattern cells when a voltage ramp is applied.

Some memory devices that use known patterns are able to achieve a lower bit error rate (BER) because they use a self-reference approach during read operations. This approach removes the need to rely on a fixed reference such as a demarcation voltage (e.g., VDM). The known patterns are programmed to have a minimum number of cells in each distribution. A voltage applied to read data cells in, for example, a page is modified according to a rate at which pattern cells are being detected.

Various approaches can be used in an attempt to achieve roughly the same number of cells in each distribution. In an example of a counter-based algorithm, the number of cells in each distribution is fixed and known, and this is used to understand when a read voltage ramp has retrieved the whole pattern. In an example of a mean estimator, the cells in each distribution are used to get an estimate of the position of the average of the distribution, and to choose a proper offset to be applied on the average to include all of the cell population.

The above methods are more reliable than using a fixed reference such as a demarcation voltage for several reasons. First, every shift of distributions which needs to be accounted in the choice of the reference is automatically included in the pattern (e.g., cells of the pattern will automatically follow all of the various shifts induced by temperature, process, cycling, etc.). Also, worst-case scenarios (e.g., placing the reference voltage halfway between the worst-case tails of the distributions) does not apply since it is unlikely to have at the same time in the same page the worst case for both the upper and lower distributions. Finally, there is less stress (e.g., read disturb) on the unselected cells since the applied voltage is adapted to the pattern which is being read.

Although known patterns as described above may provide some advantages, memory devices that are implemented for storage use cases (e.g., a solid-state drive using logical block addresses (LBAs) to store data for a host) can present technical problems even when using existing known pattern approaches to help select read voltages. For example, in a storage-like scenario where all the codewords of a same block are erased to the same pattern, it is typically recommended to keep all the cells in the erased blocks in the same physical state. This is suggested because of various considerations including the read window budget (RWB). Usually, some states are more stable than others (e.g., drift increases the read window over time).

Another consideration is performance (e.g., time/energy). It is better to have a program operation handle only one transition (e.g., only one state to avoid polarity changes, program the state which needs lower voltages, etc.).

In light of the above considerations, an erased block typically uses an erased pattern with all the cells in the RESET state. This is done because a bigger drift of the RESET state as compared to the SET state allows larger read margins. Also, for a SET state, the cells can be programmed using lower voltages.

However, using an erased pattern with all cells in the RESET state as described above can present significant technical problems. For example, when attempting to improve read operations by using known patterns to read the erased blocks, there are no SET cells available in a codeword that can be used to track the status of memory cell threshold voltage distributions. This is because the erased block only contains cells in the erased RESET state. Furthermore, the RESET distribution cannot be used since snapping of memory cells in a RESET state would corrupt the pattern. Also, for performance and power reasons a nondestructive read is preferred.

Although ternary cell balancing coding is feasible, multiple bits per cell technology makes it difficult to implement. In addition, accounting for external ASIC, e.g., employing out-of-die ECC, is also difficult.

In addition to the above, in some cases the wear and cycling of known pattern cells can vary significantly from corresponding data cells to be read. For example, pattern cells may remain written to all logic 1s, while in contrast, data cells may be exposed to numerous erase/write cycles. This can cause the pattern cells over time to become a poor proxy for the data cell distribution.

In one embodiment, for a storage-like scenario, data is stored in blocks using logical block addresses (LBAs). All memory cells in an erased block are kept in the RESET state. When erasing or writing a block, two patterns are associated with the block. For example, one of the patterns has 64 cells in the SET state (e.g., KP0), and the other pattern has 64 cells in the RESET state (e.g., KP1).

In one embodiment, the SET cells and the RESET cells of the patterns are separated and stored in two different reference tiles of the memory array. The SET and RESET cells of the patterns are toggled or swapped at every ERASE and PROGRAM command for the block (e.g., a command that operates on any data stored in the block). In one example of swapping, the logic state of patterns cells is changed so that SET cells become RESET cells, and RESET cells become SET cells. In this way, the reference SET cells are always tracking the SET cells of the data cells in the associated block (e.g., same number of cycles, same drift, etc.).

An advantage of the foregoing is that SET pattern cells are available both for program and erase operations for the block. Also, because SET and RESET pattern cells are located in different tiles, concurrent programming of the SET and RESET pattern cells can be done.

In one example, each reference tile has 64 pattern cells. The number of pattern cells should be chosen to be sufficiently high to achieve read reliability when using the fixed pattern. One consideration is the read window budget (RWB). The RWB depends on the implemented algorithm. In one example, the fixed SET cells are used to track the average threshold of the distributions, and then apply a voltage offset (e.g., 0.5V) large enough to snap all the cells of the tails (e.g., to achieve a typical storage bit error rate (BER) value). In one example, for a 4 kilobyte (KB) codeword, use of 64 plus 64 pattern bits requires a pattern overhead of only about 0.4 percent. In one example, a guard band (TH) is provided to handle open bits (e.g., defective cells). For example, each pattern can have a guard band added of 2 bits.

In one embodiment, a memory device includes a memory array having memory cells that store codewords (e.g., to store data for a host using a storage specification or a memory specification). The memory device further includes bias circuitry to apply voltages to the memory cells when reading and writing the codewords, and sensing circuitry to read the memory cells. The memory device further includes a controller to write a first codeword, and a first pattern (e.g., SET cells) and a second pattern (e.g., RESET cells) associated with the first codeword. In one example, the first and second patterns are added to the first codeword when writing the first codeword. The first pattern corresponds to a first average threshold voltage, the second pattern corresponds to a second average threshold voltage, and a magnitude of the first average threshold voltage is lower than a magnitude of the second average threshold voltage.

The controller applies, using the bias circuitry, a voltage (e.g., voltage ramp) to memory cells of the first and second patterns. The controller determines, using the sensing circuitry, a number of the memory cells of the first and second patterns that switch (e.g., threshold or snap) when applying the voltage. The controller determines when the number of memory cells that switch has reached a threshold (e.g., 64 memory cells).

In response to determining that the threshold is reached, the controller determines a read voltage based on the voltage applied to the memory cells (e.g., read voltage is based on the voltage of the ramp when the threshold is reached). Then, the controller reads the first codeword by applying, using the bias circuitry, the read voltage to memory cells of the first codeword.

Various advantages are provided by at least some embodiments described herein. In one advantage, more quickly and/or accurately determining an initial read voltage reduces the number of voltage steps required for a read operation. Also, pattern cells have a wear and cycling that is more comparable to data cells than in prior approaches.

FIG. 1 shows a memory device 101 that uses reference patterns to select a read voltage for performing read operations, in accordance with some embodiments. Memory device 101 includes a memory array 102 having data cells 110 and pattern cells 112. The data cells 110 generally store data (e.g., user data stored for host device 126). The pattern cells 112 generally store various reference patterns (e.g., known pattern of all 1s). For example, two reference patterns are associated with each codeword or block stored in data cells 110.

During a read operation to read a codeword, memory controller 120 reads the reference patterns associated with the codeword. For example, controller 120 counts a number of pattern cells 112 that snap when being read. Based on the number that snap, controller 120 selects a read voltage for reading the codeword. In one example, the read voltage is a current voltage applied to the pattern cells 112 when a threshold number of cells snap, plus the addition of an offset voltage.

In one embodiment, the pattern cells 112 are organized into various patterns including patterns 103, 105. Each of patterns 103, 105 includes memory cells of the same type. Also, the memory cells in the patterns 103, 105 are of the same type as the memory cells that store data (e.g., data cells 110). In one example, each of the patterns 103, 105 includes a relatively small number of cells such as 60-65 cells as compared to the number of cells (e.g., 256 to 4 KB) in a codeword.

Each pattern 103, 105 is associated with a codeword stored in data cells 110. Each pattern 103, 105 has pattern cells in a different logic state. For example, each of the pattern cells 112 in pattern 103 is written or programmed to store only a first logic state that corresponds to a low voltage threshold magnitude. In one example, the first logic state is a logic one (1) or SET state for a positive polarity. Each of the pattern cells 112 in pattern 105 is written or programmed to store only a second logic state that corresponds to a high voltage threshold magnitude. In one example, the second logic state is a logic zero (0) or RESET state for a positive polarity. Data cells 110 store data (e.g., user data for host device 126) in either the first logic state or the second logic state.

In one embodiment, pattern cells 112 are configured so that the operating history for pattern cells 112 is the same as or similar to data cells 110. In one example, each pattern 103, 105 is configured to correspond to a respective set of data cells 110. In one example, pattern cells 112 are in a same location of memory array 102 as data cells 110. In one example, the same location is the same tile or partition of memory array 102. In one example, the same location is a location on a same access line as data cells 110. In one example, the same location is on the same wordline as used to select data cells 110.

When performing a read operation, bias circuitry 124 applies voltages to pattern cells 112. In one example, bias circuitry 124 includes wordline and bitline drivers (not shown) to bias wordlines and bitlines of memory array 102.

Memory controller 120 determines which pattern cells 112 switch. In one example, controller 120 determines that a number of memory cells in the pattern that switch (e.g., threshold or snap) is greater than a threshold. In one example, the threshold is 50-95% or more of the memory cells in a pattern switching. Counters 104 can be used to count the number of memory cells that switch in a pattern 103, 105 and/or a number of data cells 110 that switch when being read.

Sensing circuitry 122 is used to read pattern cells 112 and data cells 110. In one example, sensing circuitry 122 includes sense amplifiers for sensing a characteristic associated with memory cells of the memory array 102. The characteristic can be, for example, a voltage and/or current associated with a selected memory cell.

Controller 120 causes bias circuitry 124 to apply voltages to each of the pattern cells 112 of patterns 103, 105. The voltages can be applied in parallel so that each pattern 103, 105 can be sensed by sensing circuitry 122 simultaneously. In one example, the voltages are increasing magnitudes of voltage values applied to each pattern 103, 105 (e.g., +2, +2.5, +3, +3.5, +4, +4.5, +5 V) separated by steps (e.g., 0.5 V steps). In one example, the voltages are separated by equal steps. In one example, the voltages are separated by steps that vary in size. The variation in the size of the steps can be determined by controller 120 based on an operating context of memory device 101, such as an error rate or other characteristic associated with prior reading of data cells of memory array 102.

After the voltages are applied to pattern cells 112, controller 120 determines which of the cells switch for each pattern. Controller 120 uses data or signals from sensing circuitry 122 that indicate which pattern cells 112 have switched.

Based on determining a number of pattern cells 112 that switch, controller 120 determines an initial read voltage to use when reading (e.g., user data) from data cells 110 that are associated with the pattern cells 112. In one example, bias circuitry 124 applies this initial read voltage to data cells 110 when starting a read. In one example, bias circuitry 124 jumps to this initial read voltage during a read of data cells 110.

Memory controller 120 includes one or more processing devices 116 and memory 118. In one example, memory 118 stores firmware executed by processing device 116 to select and apply the read voltages.

Memory controller 120 can use bias circuitry 124 to generate voltages for applying read and other voltages (e.g., initial read and read retry). Bias circuitry 124 can also generate voltages for applying write voltages to data cells 110, and/or pattern cells 112 as part of programming operations. Bias circuitry 124 may be used to generate read voltages for read operations performed on memory array 102 (e.g., in response to a read command from host device 126).

Sensing circuitry 122 can be used to sense a state of each memory cell in memory array 102. In one example, sensing circuitry 122 includes sense amplifiers used to detect a current caused by applying various voltages to memory cells in memory array 102. In one example, bias circuitry 124 applies a read voltage to data cells 110 or pattern cells 112. Sensing circuitry 122 senses a current associated with each of the data cells 110 or pattern cells 112 caused by applying the read voltage.

In one example, if sensing circuitry 122 determines that the current for a memory cell is greater than a fixed threshold (e.g., a predetermined level of current), then memory controller 120 determines that the memory cell has switched (e.g., snapped).

In one embodiment, memory controller 120 receives a write command from a host device 126. The write command is accompanied by data (e.g., user data of a user of host device 126) to be written to memory array 102. In response to receiving the write command, controller 120 initiates a programming operation.

In one embodiment, controller 120 uses one of counters 104 to count the number of data or pattern cells that snap as a read voltage is applied. Data stored in counters 104 can be used as part of an evaluation when determining a read voltage to apply. This stored data can optionally be used in combination with error results from ECC of read data when selecting the read voltage (e.g., a read retry voltage). For example, the stored data and/or ECC results can be provided as inputs to a machine learning model (e.g., artificial neural network) to provide an output of a voltage to use for read retry.

Controller 120 includes one or more registers 107. In one embodiment, each register 107 can store data regarding a state of pattern cells 112 and/or data cells 110. In one example, register 107 stores data indicating which of patterns 103, 105 is in a SET state. In one example, register 107 stores data indicating which of patterns 103, 105 was most recently erased. In one example, register 107 stores data indicating whether data cells 110 store inverted data or data that is not inverted.

Memory device 101 includes randomizer 180. In one embodiment, controller 120 uses randomizer 180 to determine, for each write operation to store data in data cells 110, whether to toggle or swap patterns 103, 105. In one example, randomizer 180 is configured so that controller 120 on average determines to toggle or swap patterns 103, 105 for 50% (or other selected percentage) of write operations.

In one example, controller 120 may use write voltages (e.g., write pulses) to write a logic state to a memory cell, such as data cell 110 or pattern cell 112 during a write or programming operation. The write pulses may be applied by providing a first voltage to a bitline and providing a second voltage to a wordline to select the memory cell. Circuits coupled to access lines to which memory cells may be coupled may be used to provide the write voltages (e.g., access line drivers included in decoder circuits). The circuits may be controlled by internal control signals provided by a control logic (e.g., controller 120). The resulting voltage applied to the memory cell is the difference between the first and second voltages. The write pulses may be the same duration as read pulses in some embodiments. In some embodiments the duration is 10-50 ns. In some embodiments, the duration is 1-100 ns. In some embodiments, the duration is 1 ns to 1 microsecond. Writing to the memory cell may take the same time as reading the memory cell in some embodiments.

In one example, the polarity of the read or write pulses may be either a first polarity or a second polarity. For example, a write pulse may apply a voltage to a memory cell in a first polarity (e.g., bitline at 6V and wordline at 0V).

In one example, circuits coupled to access lines to which memory cells may be coupled are used to provide read pulses (e.g., access line drivers included in decoder circuits). The circuits may be controlled by internal control signals provided by a control logic (e.g., controller 120). A read voltage or pulse may be a voltage applied to a memory cell for a period of time (e.g., 10-50 ns, 1-100 ns, 1 ns to 1 microsecond). In some embodiments, the read pulse may be a square pulse. In some embodiments, the read pulse may be a ramp, that is, a linearly-increasing voltage may be applied across the memory cell.

In one example, after being accessed (e.g., selected), a memory cell may be read, or sensed, by a sense component (e.g., sensing circuitry 122) to determine the stored state of the memory cell. For example, a voltage may be applied to the memory cell (using a wordline and bitline) and the presence of a resulting current may depend on the applied voltage and the threshold voltage of the memory cell. In some cases, more than one voltage may be applied. Additionally, if an applied voltage does not result in current flow, other voltages may be applied until a current is detected by the sense component. By assessing the voltage that resulted in current flow, the stored logic state of the memory cell may be determined. In some cases, the voltage may be ramped up in magnitude until a current flow is detected (e.g., a memory cell turns on, switches on, conducts current, or becomes activated). In other cases, predetermined voltages may be applied sequentially until a current is detected. Likewise, a current may be applied to a memory cell, and the magnitude of the voltage to create the current may depend on the electrical resistance or the threshold voltage of the memory cell.

In some cases, the memory cell (e.g., a PCM cell) includes a material that changes its crystallographic configuration (e.g., between a crystalline phase and an amorphous phase), which in turn, determines a threshold voltage of the memory cell to store information. In other cases, the memory cell includes a material that remains in a crystallographic configuration (e.g., an amorphous phase) that may exhibit variable threshold voltages to store information.

The sense component may include various transistors or amplifiers in order to detect and amplify a difference in the signals. The detected logic state of the memory cell may then be output through a column decoder as output. In some cases, the sense component may be part of a column decoder or a row decoder.

Figure 2:
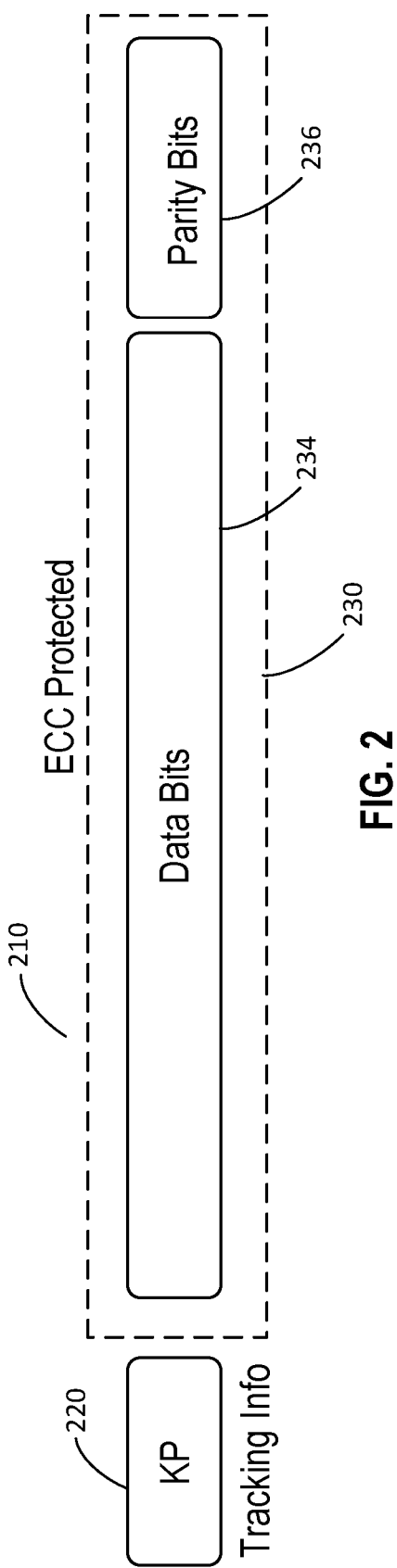
FIG. 2 shows a codeword with added known pattern bits, in accordance with some embodiments.

FIG. 2 shows a codeword 210 with added known pattern bits 220 in accordance with some embodiments. The codeword 210 includes data cells 230 in addition to the known pattern (KP) bits 220. The data cells 230 include data bits 234 and parity bits 236, and both are protected by error correction code (ECC). The known pattern bits 220 are added to the codeword 210 to track a distribution shift of the cell threshold voltage in the codeword 210. The known pattern bits 220 may be specific for each state. For example, KP0 bits (low threshold voltage) for tracking level 0 codeword; and KP1 (high threshold voltage) for tracking level 1 codeword. Similarly, the known pattern bits 220 can be tailored to another desired voltage for multi-bit per cell technology. In an example, the known pattern bits 220 have 8 memory cells.

Figure 3:
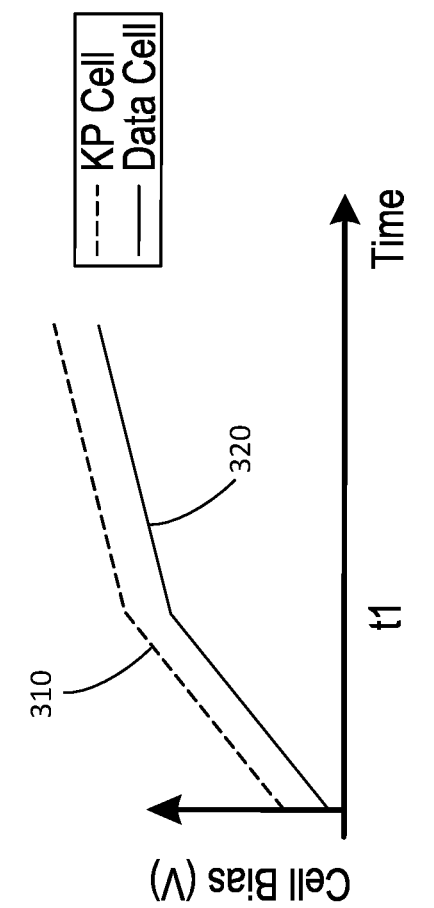
FIG. 3 shows ramping read voltages for both the data cells and the KP cells, in accordance with some embodiments.

FIG. 3 shows ramping read voltages for both the data cells and the KP cells in accordance with some embodiments. The ramping read voltages linearly rise with respect to each ramping step (e.g., several ramping steps can be used). In other words, a next voltage is higher than the current voltage by a fixed increment. As shown in FIG. 3, a dotted line 310 represents the ramped read voltage on the KP cells. A solid line 320 represents the ramped read voltage on the data cells. The dotted line 310 is higher than the solid line 320 because the voltage applied to the KP cells is higher than the voltage applied to the data cells. One reason for this is that threshold voltages of the KP cells are generally lower than that of the data cells, and read disturbance of the KP cells is less concerned.

As shown in FIG. 3, the ramp rates of both the dotted line 310 and solid line 320 turn lower after time t1. Before time t1, the applied read voltages are relatively low causing less read disturbances, so that the read voltages can be ramped up more quickly. However, after the read voltages reach a certain level at time t1, read disturbance becomes more of a concern, so that the read voltages are controlled to begin to ramp up slowly. An exemplary algorithm for determining an appropriate time t1 will be described hereinafter.

FIG. 4 shows threshold voltage (VTH) distributions of memory cells in a codeword. The distributions demonstrate bell curves 413 for KP cells and 420 for data cells in logic 0 state and 430 for data cells in logic 1 state. As the KP cells and data cells are identical, they have similar threshold voltage distributions (e.g., the bell curves 413 and 420 have similar center points and shape). However, since a higher read voltage is applied to the KP cells, the threshold voltage of the KP cells will appear to be lower than that of the data cells, as illustrated by a bell curve 410.

FIG. 5 shows shifts of threshold voltage (VTH) distributions of memory cells in a codeword. After the memory cells go through numerous write and erase cycles, a bell curve 510 representing the KP cells' VTH distribution, and bell curves 520 and 530 representing the data cells' VTH distributions each shift toward a lower VTH. Time and/or other factors may cause a bell curve 512 representing the KP cells' VTH distribution and bell curves 522 and 532 representing the data cells' VTH distributions to shift toward a higher VTH.

Figure 6:
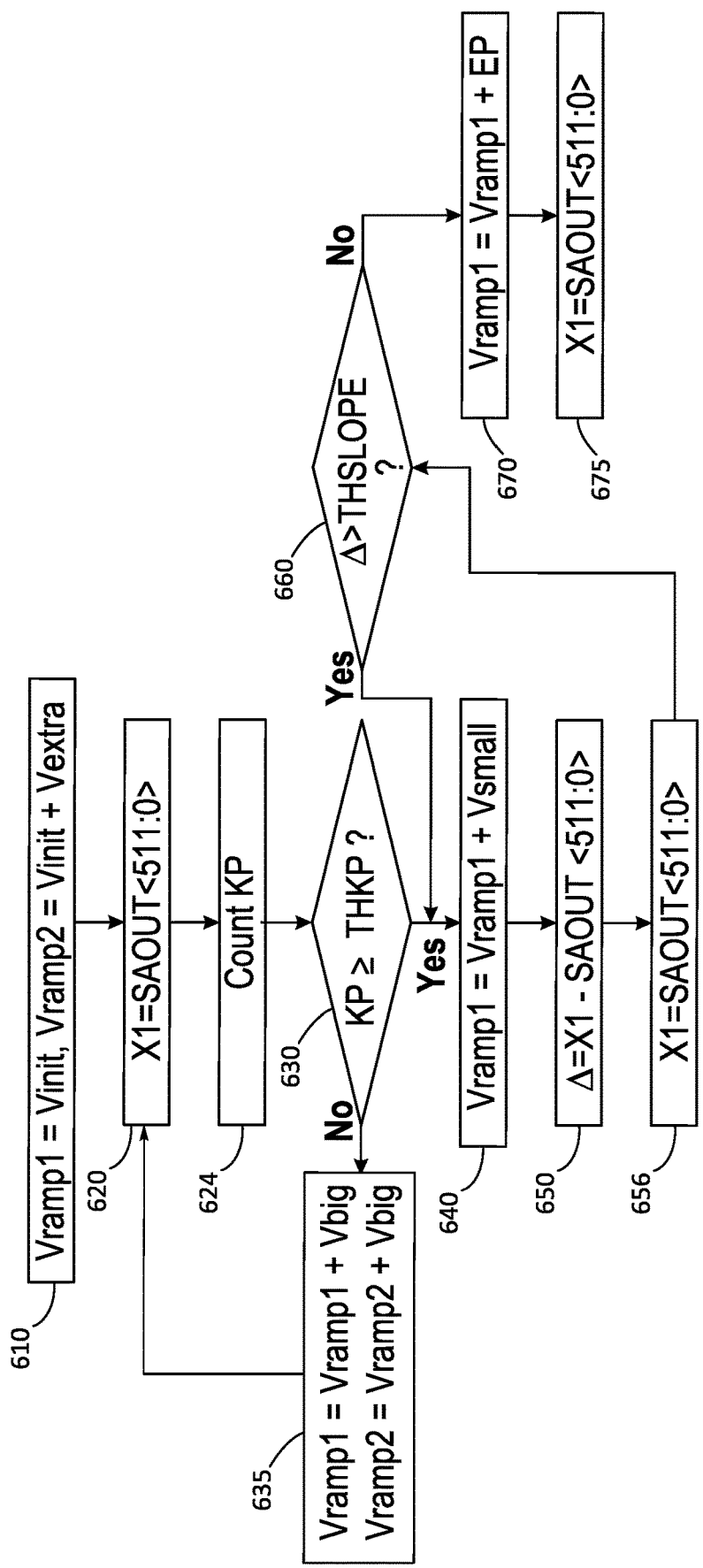
FIG. 6 is a flowchart illustrating a forward looking algorithm (FLA) for detecting a threshold voltage distribution of data cells in accordance with some embodiments.

FIG. 6 is a flowchart illustrating a forward looking algorithm (FLA) for detecting a threshold voltage distribution of data cells in accordance with some embodiments. The FLA applies a first ramp voltage (e.g., Vramp1 corresponding to 320 in FIG. 3) on the data cells and a second ramp voltage (e.g., Vramp2 corresponding to 310 in FIG. 3) on the KP cells. In embodiments, the Vramp1 and Vramp2 simultaneously ramp up like staircases with height of each stair step adjustable, and in each step, the Vramp2 is higher than the Vramp1 by a predetermined extra bias voltage (Vextra).

In block 610, the FLA starts with an initial voltage (Vinit) for the Vramp1. Then, the Vramp2's initial voltage is Vinit plus Vextra. In block 620, states of both the data cells and the KP cells are read out by sense amplifiers with a number of logic 1 cells stored in a buffer X1. The exemplary codeword has 512 bits. SAOUT<511:0> indicates reading each cell by sense amplifiers. Both the data cells and the KP cells are at logic 0 or set state. They become a logic 1 or reset state when the read voltage is higher than their threshold voltage.

In block 624, a number of logic 1 cells in the KP cells is counted. In block 630, the counted number of logic 1 KP cells is compared with a predetermined threshold (THKP). If the counted number is lower than the THKP, the FLA enters block 635 in which both Vramp1 and Vramp2 are increased by a first predetermined value (e.g., Vbig which is a first height of a stair step). If the counted number is equal to or higher than the THKP, the FLA enters block 640 in which Vramp1 is increased by a second predetermined value (e.g., Vsmall which a second height of a stair step). In embodiments, the Vbig is higher than the Vsmall by a predetermined voltage. Therefore, when enough KP cells are turned to logic 1 state under Vramp2, the ramping rate of the Vramp1 on the data cells will be lowered so that the voltage ramping on the data cells become finer (e.g., changes at a lower rate). The entering to block 640 corresponds to the turning points at time t1 shown in FIG. 3.

Referring again to FIG. 6, in blocks 650 and 656, the number of logic 1 data cells is sensed, and a distribution slope is calculated from a difference between a current number and a previous number (Δ=X1−SAOUT<511:0>). In an embodiment, an absolute value of the difference is used for the distribution slope calculation. In this case, the focus is on a steepness of the slope, and not on a direction of the slope.

In block 660, the calculated distribution slope is compared with a predetermined threshold (THSLOPE). If the calculated distribution slope is higher than THSLOPE, the FLA returns to block 640 to perform another voltage ramping cycle for the data cells. Otherwise, the FLA exits the voltage ramping cycle and enters block 670. The THSLOPE is small enough to indicate that a tail end of a bell curve is reached (e.g., almost all the data cells have turned to logic 1 state).

A final Vramp1 of voltage ramping cycle reflects a current threshold voltage distribution of the data cells, and is then provided to the sense amplifiers as a sensing reference voltage. In block 670, an extra pulse (EP) is added to Vramp1 which is then applied to the data cells to turn almost all of the data cells to logic 1. Then, the FLA enters a final block 675 in which the number of logic 1 data cells is sensed and recorded in the buffer X1.

Referring again to the FIG. 6, after block 640, voltage ramping and sensing for the KP cells becomes optional (not shown). This is because the use of KP cells is to detect the turning point at time t1. Once the turning point is obtained, sensing KP cells is no longer needed. Similarly, before reaching the turning point at time t1, voltage ramping and sensing for data cells are also optional.

The above-described FLA does not require data manipulation, and thus is advantageous in one or more of the following regards: faster write time; independent of actual number of logic 1's; easy to extend to multi-bit per cell technology; working well with internal or external ECC engine (does not require syndrome calculation feedback); not requiring higher ECC power; and achieving lower bit error rate (BER) as usage is tracked. However, the use of KP cells increases overhead. For example, providing 8 KP cells in a 512-bit page results in about 1.5% loss of storage capacity.

Figure 7:
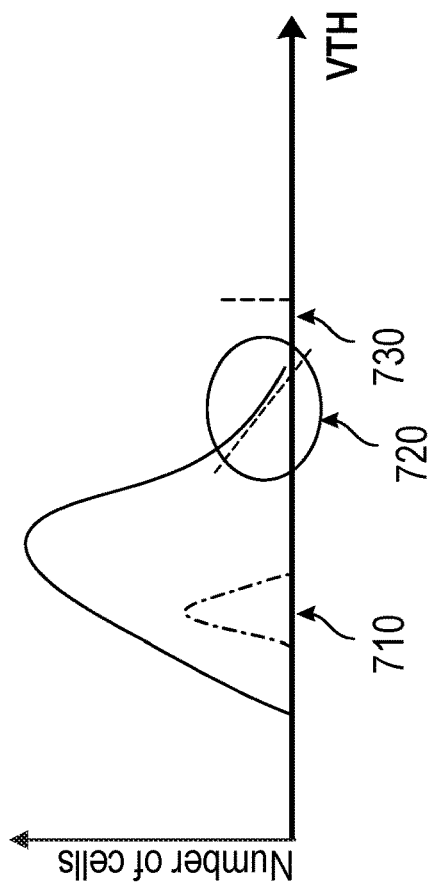
FIG. 7 shows phases of detecting the cell threshold voltage (VTH) distribution in accordance with some embodiments.

FIG. 7 shows phases of detecting the cell threshold voltage (VTH) distribution in accordance with some embodiments. In a first phase 710, the FLA tracks VTH distribution of the KP cells by counting a number of logic 1 cells. In a second phase 720, the FLA extracts a slope of the distribution bell curve. In a third phase, an extra pulse is added to the read voltage to capture a tail of the bell curve distribution.

In embodiments, the FLA also tracks a sign of the calculated slope. When the calculated slope is negative, the distribution is in a rising slope; and when the slope is positive, the distribution is in a falling slope. When the calculated slope changes from positive to negative, this indicates that an intercept of two distribution levels has reached. Referring back to FIG. 4, the bell curve 420 represents a first distribution level, and the bell curve 430 represents a second distribution level. The calculated slope will change sign from positive to negative when the ramping voltage reaches the second distribution level. This information may be combined with others to generate a soft data or "bit-invert" type of correction with the latest switched cell at negative slope as the most likely to be inverted.

Figure 8:
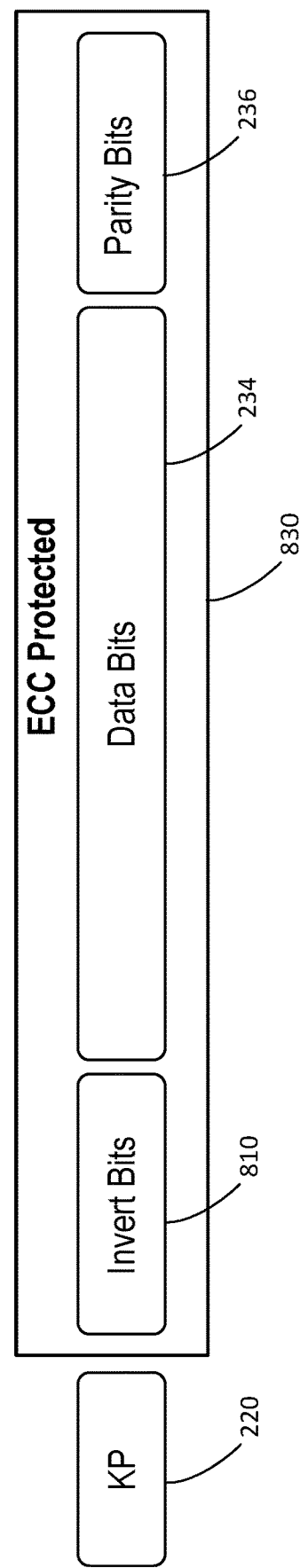
FIG. 8 shows a codeword with added invert bits in accordance with some embodiments.

FIG. 8 shows a codeword with added invert bits 810 in accordance with some embodiments. The invert bits 810 are added to the data cells 830 which also includes, for example, the data bits 234 and parity bits 236.

Figure 9:
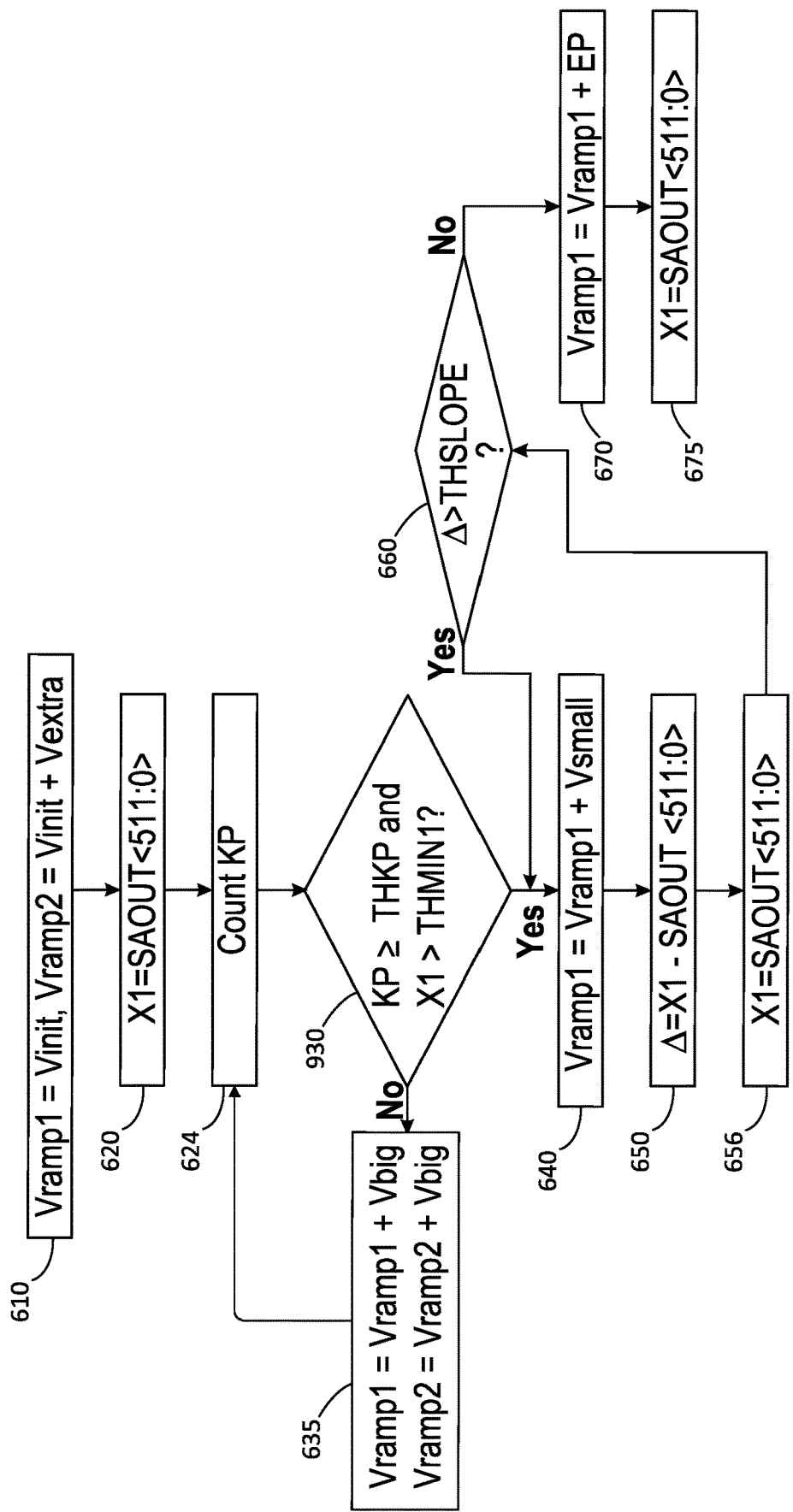
FIG. 9 is a flowchart illustrating an alternative forward looking algorithm (FLA) for detecting a threshold voltage distribution of data cells in accordance with some embodiments.

FIG. 9 is a flowchart illustrating an alternative forward looking algorithm (FLA) for detecting a threshold voltage distribution of data cells in accordance with some embodiments. The flowchart shown in FIG. 9 is identical to the flowchart shown in FIG. 6 except block 630 in FIG. 6 is replaced by block 930 in FIG. 9. In block 930, the alternative FLA not only compares the number of logic 1 in the KP cells with the predetermined threshold (THKP), but also compares the number of logic 1 in the data cells (X1) with a predetermined minimum threshold (THMIN1). The THMIN1 represents a minimum number of logic 1 in the data cells. Executing the block 930 ensures that a sufficient number of data cells are turned to logic 1 before the voltage ramping is switched to smaller increments.

In addition, the alternative FLA can also include an operation to check if a maximum number of read pulses have been reached after each read cycle (not shown).

FIG. 10 shows a table illustrating an exemplary data manipulation by constraining the logic 1's. Using an additional 4 invert bits, any 512 bit codeword may be constrained to have from 256 to 320 bits at a logic 1 state (e.g., the minimum number of logic 1 (THMIN1 in FIG. 9) is 256). A randomizer may be used as well to statistically give enough logic 1's. This is especially helpful for multi-bit per cell technology.

Figure 11:
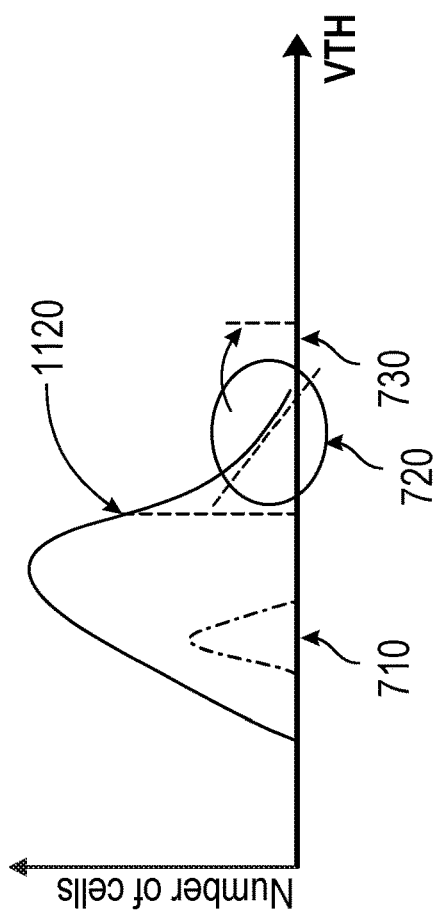
FIG. 11 shows a cell threshold voltage (VTH) distribution detected by an algorithm based on the flowchart shown in FIG. 9.

FIG. 11 shows a cell threshold voltage (VTH) distribution detected with an algorithm based on the flowchart shown in FIG. 9. The minimum number of logic 1 data cells is predetermined at a point 1120. Before the point 1120, the ramping voltage increases by Vbig in each step; after the point 1120, the ramping voltage increases by Vsmall in each step.

Figure 12:
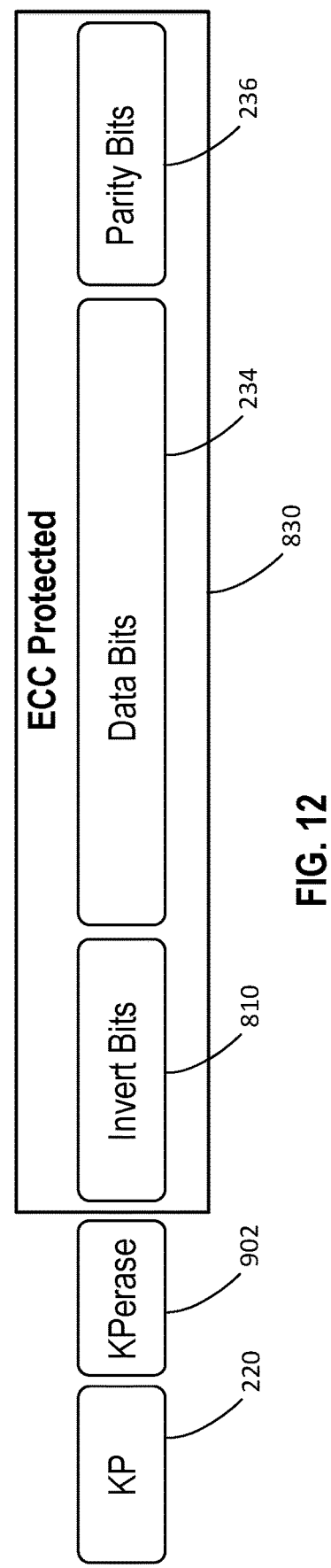
FIG. 12 shows a codeword with KPerase bits further added in accordance with some embodiments.

FIG. 12 shows a codeword with KPerase bits 902 further added in accordance with some embodiments. The KPerase bits 902 reflect page erase status. When a memory block is erased with the KPerase bits 902 flagging, a read operation will be stopped. In this case, the ECC protected part 830 of the codeword shown in FIG. 12 is all at logic 0 state. By erasing the memory block, data is manipulated to guarantee a min-max logic 1's range. Minimum number of logic 1 is used to cope with bimodal distributions, while derivative control as shown in FIG. 6 is used to address distribution widening (squeezing) with memory device usage over time and the emergence of the distribution tail.

Figure 13:
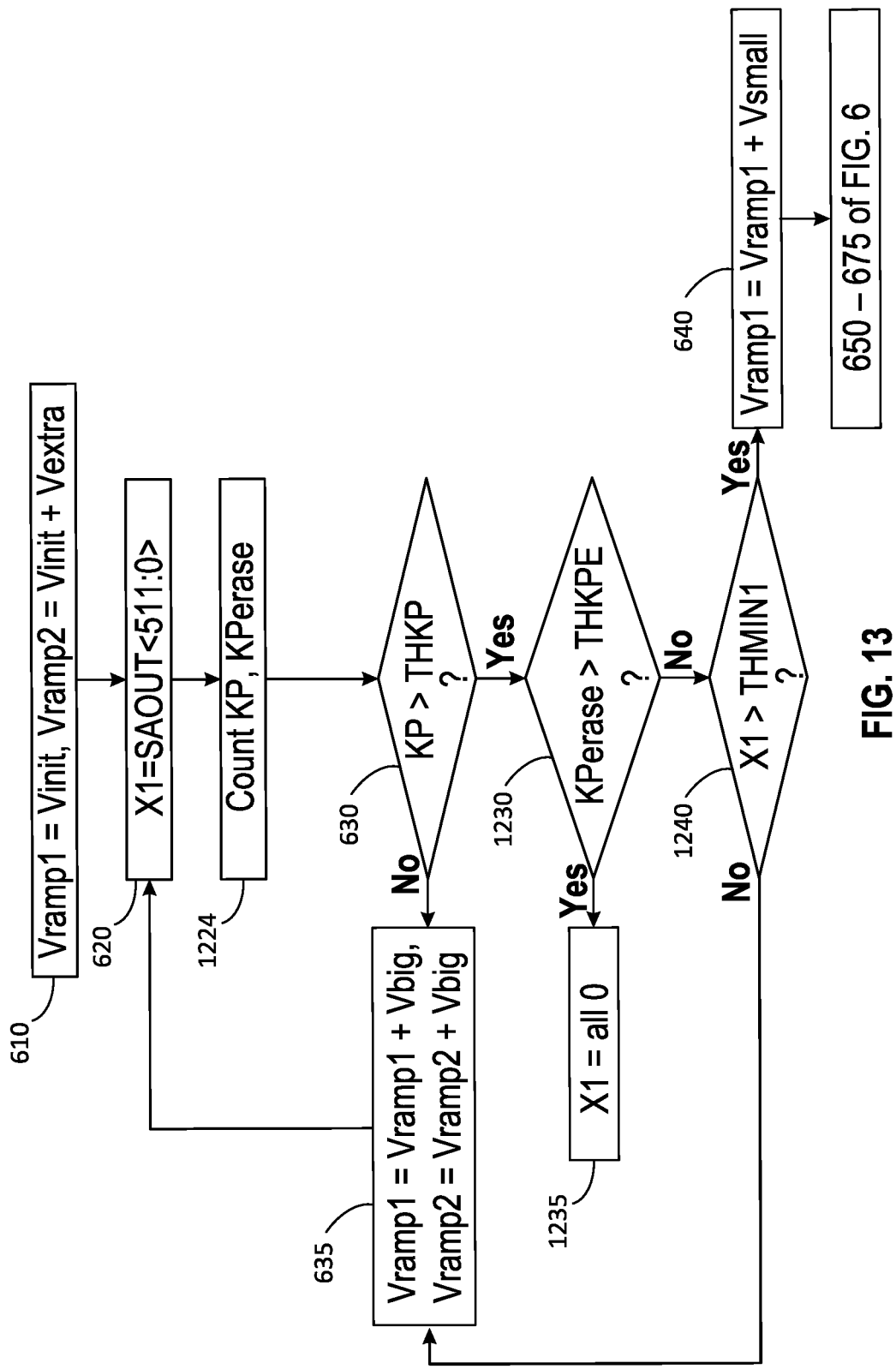
FIG. 13 is a flowchart illustrating another alternative forward looking algorithm (FLA) with data manipulation for detecting a threshold voltage distribution of data cells in accordance with some embodiments.

FIG. 13 is a flowchart illustrating another alternative forward looking algorithm (FLA) with data manipulation for detecting a threshold voltage distribution of data cells in accordance with some embodiments. The alternative FLA shown in FIG. 13 starts with blocks 610 and 620 from the FLA shown in FIG. 6. After block 620, the alternative FLA counts number of logic 1 in KP bits and number of logic 0 in KPerase bits in block 1224. The alternative FLA shown in FIG. 13 then enters the block 630 which is also employed by the FLA shown in FIG. 6.

If the number of logic 1 in the KP bits is not higher than the predetermined KP threshold (THKP), the alternative FLA enters block 635 in which the voltages, Vramp1 and Vramp2, are ramped up by a predetermined large interval Vbig. With the increased Vramp1 and Vramp2, the number of logic 1's in both the data cells and KP cells are sensed again in block 620 and counted again in block 1224. If the number of logic 1's in the KP bits is higher than the predetermined THKP, the alternative FLA progresses to block 1230 in which the number of logic 0's in KPerase bits is compared with a predetermined threshold (THKPE).

If the number of logic 0's in the KPerase bits is higher than the THKPE indicating that the memory block is erased, the alternative FLA resets the counter X1 to all logic 0's in block 1235 and then ends the voltage ramping process. If the number of logic 0's in the KPerase bits is not higher than the THPKE indicating that the memory block is not erased, the alternative FLA enters block 1240 in which the number of logic 1's (X1) in the data cells is compared with the predetermined minimum threshold (THMIN1). If the THMIN1 is passed (X1>THMIN1), the alternative FLA proceeds to block 640 and subsequently blocks 650 to 675 of FIG. 6. In block 640 and thereafter, the ramping voltage on the data cells, Vramp1, increases each time by a small interval Vsmall.

The disclosure includes various devices which perform the methods and implement the systems described above, including data processing systems which perform these methods, and computer-readable media containing instructions which when executed on data processing systems cause the systems to perform these methods.

The description and drawings are illustrative and are not to be construed as limiting. Numerous specific details are described to provide a thorough understanding. However, in certain instances, well-known or conventional details are not described in order to avoid obscuring the description. References to one or an embodiment in the present disclosure are not necessarily references to the same embodiment; and, such references mean at least one.

As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

In this description, various functions and/or operations may be described as being performed by or caused by software code to simplify description. However, those skilled in the art will recognize what is meant by such expressions is that the functions and/or operations result from execution of the code by one or more processing devices, such as a microprocessor, Application-Specific Integrated Circuit (ASIC), graphics processor, and/or a Field-Programmable Gate Array (FPGA). Alternatively, or in combination, the functions and operations can be implemented using special purpose circuitry (e.g., logic circuitry), with or without software instructions. Embodiments can be implemented using hardwired circuitry without software instructions, or in combination with software instructions. Thus, the techniques are not limited to any specific combination of hardware circuitry and software, nor to any particular source for the instructions executed by a computing device.

While some embodiments can be implemented in fully functioning computers and computer systems, various embodiments are capable of being distributed as a computing product in a variety of forms and are capable of being applied regardless of the particular type of computer-readable medium used to actually effect the distribution.

At least some aspects disclosed can be embodied, at least in part, in software. That is, the techniques may be carried out in a computing device or other system in response to its processing device, such as a microprocessor, executing sequences of instructions contained in a memory, such as ROM, volatile RAM, non-volatile memory, cache or a remote storage device.

Routines executed to implement the embodiments may be implemented as part of an operating system, middleware, service delivery platform, SDK (Software Development Kit) component, web services, or other specific application, component, program, object, module or sequence of instructions (sometimes referred to as computer programs). Invocation interfaces to these routines can be exposed to a software development community as an API (Application Programming Interface). The computer programs typically comprise one or more instructions set at various times in various memory and storage devices in a computer, and that, when read and executed by one or more processors in a computer, cause the computer to perform operations necessary to execute elements involving the various aspects.

A computer-readable medium can be used to store software and data which when executed by a computing device causes the device to perform various methods. The executable software and data may be stored in various places including, for example, ROM, volatile RAM, non-volatile memory and/or cache. Portions of this software and/or data may be stored in any one of these storage devices. Further, the data and instructions can be obtained from centralized servers or peer to peer networks. Different portions of the data and instructions can be obtained from different centralized servers and/or peer to peer networks at different times and in different communication sessions or in a same communication session. The data and instructions can be obtained in entirety prior to the execution of the applications. Alternatively, portions of the data and instructions can be obtained dynamically, just in time, when needed for execution. Thus, it is not required that the data and instructions be on a computer-readable medium in entirety at a particular instance of time.

Examples of computer-readable media include, but are not limited to, recordable and non-recordable type media such as volatile and non-volatile memory devices, read only memory (ROM), random access memory (RAM), flash memory devices, solid-state drive storage media, removable disks, magnetic disk storage media, optical storage media (e.g., Compact Disk Read-Only Memory (CD ROMs), Digital Versatile Disks (DVDs), etc.), among others. The computer-readable media may store the instructions. Other examples of computer-readable media include, but are not limited to, non-volatile embedded devices using NOR flash or NAND flash architectures. Media used in these architectures may include un-managed NAND devices and/or managed NAND devices, including, for example, eMMC, SD, CF, UFS, and SSD.

In general, a non-transitory computer-readable medium includes any mechanism that provides (e.g., stores) information in a form accessible by a computing device (e.g., a computer, mobile device, network device, personal digital assistant, manufacturing tool having a controller, any device with a set of one or more processors, etc.). A "computer-readable medium" as used herein may include a single medium or multiple media (e.g., that store one or more sets of instructions).

In various embodiments, hardwired circuitry may be used in combination with software and firmware instructions to implement the techniques. Thus, the techniques are neither limited to any specific combination of hardware circuitry and software nor to any particular source for the instructions executed by a computing device.

Various embodiments set forth herein can be implemented using a wide variety of different types of computing devices. As used herein, examples of a "computing device" include, but are not limited to, a server, a centralized computing platform, a system of multiple computing processors and/or components, a mobile device, a user terminal, a vehicle, a personal communications device, a wearable digital device, an electronic kiosk, a general purpose computer, an electronic document reader, a tablet, a laptop computer, a smartphone, a digital camera, a residential domestic appliance, a television, or a digital music player. Additional examples of computing devices include devices that are part of what is called "the internet of things" (IOT). Such "things" may have occasional interactions with their owners or administrators, who may monitor the things or modify settings on these things. In some cases, such owners or administrators play the role of users with respect to the "thing" devices. In some examples, the primary mobile device (e.g., an Apple Phone) of a user may be an administrator server with respect to a paired "thing" device that is worn by the user (e.g., an Apple watch).

In some embodiments, the computing device can be a computer or host system, which is implemented, for example, as a desktop computer, laptop computer, network server, mobile device, or other computing device that includes a memory and a processing device. The host system can include or be coupled to a memory sub-system so that the host system can read data from or write data to the memory sub-system. The host system can be coupled to the memory sub-system via a physical host interface. In general, the host system can access multiple memory sub-systems via a same communication connection, multiple separate communication connections, and/or a combination of communication connections.

In some embodiments, the computing device is a system including one or more processing devices. Examples of the processing device can include a microcontroller, a central processing unit (CPU), special purpose logic circuitry (e.g., a field programmable gate array (FPGA), an application specific integrated circuit (ASIC), etc.), a system on a chip (SoC), or another suitable processor.

In one example, a computing device is a controller of a memory system. The controller includes a processing device and memory containing instructions executed by the processing device to control various operations of the memory system.

Although some of the drawings illustrate a number of operations in a particular order, operations which are not order dependent may be reordered and other operations may be combined or broken out. While some reordering or other groupings are specifically mentioned, others will be apparent to those of ordinary skill in the art and so do not present an exhaustive list of alternatives. Moreover, it should be recognized that the stages could be implemented in hardware, firmware, software or any combination thereof.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A method for reading a memory array having a first and second plurality of cells, the method comprising:
    applying a first ramping voltage with a first predetermined increment for each of a plurality of ramping steps of the first ramping voltage to read the first plurality of cells;
    counting, among the first plurality of cells at each ramping step of the first ramping voltage, a first number of cells at a logic 1 state;
    comparing the first number with a first predetermined threshold at each ramping step of the first ramping voltage;
    determining a first voltage reached by the first ramping voltage, at the first voltage the first number becoming equal to or higher than the first predetermined threshold;
    applying a second voltage to read the second plurality of cells, the second voltage being lower than the first voltage by a first predetermined amount; and
    applying a second ramping voltage ramping up from the second voltage with a second predetermined increment for each ramping step to read the second plurality of cells, the second predetermined increment being lower than the first predetermined increment by a second predetermined amount.

2. The method of claim 1, wherein the first plurality of cells are known pattern cells and the second plurality of cells are data cells.

3. The method of claim 1, further comprising applying a third ramping voltage ramping up to the second voltage to read the second plurality of cells, the third ramping voltage using the first predetermined increment for each ramping step.

4. The method of claim 3, further comprising:
    counting, among the second plurality of cells at each ramping step of the third ramping voltage, a second number of cells at a logic 1 state;
    comparing the second number with a second predetermined threshold; and
    determining the first voltage when both a first and second condition are satisfied for a first time, the first condition being the first number becoming equal to or higher than the first predetermined threshold, and the second condition being the second number becoming higher than the second predetermined threshold.

5. The method of claim 1, further comprising:
    counting, among the second plurality of cells at a first step of the second ramping voltage, a third number of cells at the logic 1 state;
    counting, among the second plurality of cells at a second step of the second ramping voltage, a fourth number of cells at the logic 1 state, the second step immediately following the first step;
    calculating a difference between the third number and the fourth number; and
    stopping the second ramping voltage when an absolute value of the difference is smaller than a third predetermined threshold.

6. The method of claim 5, further comprising providing the stopping voltage of the second ramping voltage to a sense amplifier.

7. The method of claim 5, further comprising:
    adding a pulsed voltage to the stopping voltage of the second ramping voltage to read the second plurality of cells; and
    counting, among the second plurality of cells, a fifth number of cells at the logic 1 state.

8. The method of claim 1, further comprising:
    reading a third plurality of cells located adjacent the first and second plurality of cells; and
    stopping the first ramping voltage when a number of cells at a logic 0 state among the third plurality of cells exceeds a fourth predetermined threshold.

9. The method of claim 8, wherein the third plurality of cells reflects page erase status.

10. The method of claim 1, further comprising stopping the second ramping voltage when a predetermined number of steps in the second ramping voltage is reached.

11. A memory device comprising:
    a memory array having a first and second plurality of cells;
    a controller configured to:

apply a first ramping voltage with a first predetermined increment for each of a plurality of ramping steps of the first ramping voltage to read the first plurality of cells;

count, among the first plurality of cells at each ramping step of the first ramping voltage, a first number of cells at a logic 1 state;

compare the first number with a first predetermined threshold at each ramping step of the first ramping voltage;

determine a first voltage reached by the first ramping voltage, at the first voltage the first number becoming equal to or higher than the first predetermined threshold;

apply a second voltage to read the second plurality of cells, the second voltage being lower than the first voltage by a first predetermined amount; and apply a second ramping voltage ramping up from the second voltage with a second predetermined increment for each ramping step to read the second plurality of cells, the second predetermined increment being lower than the first predetermined increment by a second predetermined amount.

12. The memory device of claim 11, wherein the first plurality of cells are known pattern cells and the second plurality of cells are data cells.

13. The memory device of claim 11, wherein the controller is further configured to apply a third ramping voltage ramping up to the second voltage to read the second plurality of cells, the third ramping voltage using the first predetermined increment for each ramping step.

14. The memory device of claim 13, wherein the controller is further configured to:

count, among the second plurality of cells at each ramping step of the third ramping voltage, a second number of cells at a logic 1 state;

compare the second number with a second predetermined threshold at each ramping step; and determine the first voltage when both a first and second condition are satisfied for a first time, the first condition being the first number becoming equal to or higher than the first predetermined threshold, and the second condition being the second number becoming higher than the second predetermined threshold.

15. The memory device of claim 11, wherein the controller is further configured to:

count, among the second plurality of cells at a first step of the second ramping voltage, a third number of cells at the logic 1 state;

count, among the second plurality of cells at a second step of the second ramping voltage, a fourth number of cells at the logic 1 state, the second step following the first step;

calculate a difference between the third number and the fourth number; and stop the second ramping voltage when an absolute value of the difference is smaller than a third predetermined threshold.

16. The memory device of claim 15, wherein the controller is further configured to:

add a pulsed voltage to the stopping voltage of the second ramping voltage to read the second plurality of cells; and count, among the second plurality of cells, a fifth number of cells at the logic 1 state.

17. The memory device of claim 11, the controller is further configured to:

read a third plurality of cells located adjacent the first and second plurality of cells; and stop the first ramping voltage when a number of cells at a logic 0 state among the third plurality of cells exceeds a fourth predetermined threshold.

18. The memory device of claim 17, wherein the third plurality of cells reflects page erase status.

19. The memory device of claim 11, wherein the controller is further configured to stop the second ramping voltage when a predetermined number of steps in the second ramping voltage is reached.

20. A method for reading a memory array, the method comprising:

simultaneously applying a first voltage and second voltage to read a first and second plurality of memory cells, respectively, the first voltage being higher than the second voltage by a first predetermined amount, the first plurality of memory cells having a known pattern;

counting a first number of cells turned to a logic 1 state in the first plurality of memory cells; and subsequently applying a third voltage to read the second plurality of memory cells in response to the counting, wherein the third voltage is higher than the first voltage by either a second predetermined amount or a third predetermined amount lower than the second predetermined amount, wherein the second predetermined amount is chosen when the first number is lower than a first predetermined threshold, and the third predetermined amount is chosen when the first number is equal to or higher than the first predetermined threshold.

* * * * *